United States Patent [19]
Nelson et al.

[11] Patent Number: 6,061,075
[45] Date of Patent: May 9, 2000

[54] NON-SYSTOLIC TIME DELAY AND INTEGRATION PRINTING

[75] Inventors: William E. Nelson; Paul M. Urbanus, both of Dallas; Jeffrey B. Sampsell; Robert Mark Boysel, both of Plano, all of Tex.

[73] Assignee: Texas Instruments Incorporated, Dallas, Tex.

[21] Appl. No.: 08/257,232

[22] Filed: Jun. 9, 1994

Related U.S. Application Data

[63] Continuation of application No. 07/824,660, Jan. 23, 1992, abandoned.

[51] Int. Cl.[7] .................................................. B41J 2/385
[52] U.S. Cl. ........................... 347/134; 347/239; 347/243
[58] Field of Search ................. 346/107 R, 160; 358/456; 347/134, 234, 239, 243

[56] References Cited

U.S. PATENT DOCUMENTS

| | | | |
|---|---|---|---|
| 4,560,994 | 12/1985 | Sprague | 346/108 |
| 4,838,652 | 6/1989 | Inaba et al. | 346/160 X |
| 4,933,687 | 6/1990 | Winsor | 347/242 |
| 5,049,901 | 9/1991 | Gelbart | 346/107 R |
| 5,121,146 | 6/1992 | Smith et al. | 346/160 |

FOREIGN PATENT DOCUMENTS

| | | |
|---|---|---|
| 0 072 124 | 2/1983 | European Pat. Off. . |
| 2 017 590 | 10/1979 | United Kingdom . |

OTHER PUBLICATIONS

*Turbo Pascal* by Keith Weiskamp. ©1991 pp. 115, 168 & 169 John Wiley & Sons, Inc.

*Primary Examiner*—Randy W. Gibson
*Attorney, Agent, or Firm*—Charles A. Brill; Wade James Brady, III; Frederick J. Telecky, Jr.

[57] ABSTRACT

A method for printing or exposing photosensitive media is disclosed herein. The method uses standard spatial light modulators with standard addressing circuitry. The data is written to the device for the first row, the photosensitive media is exposed to the light reflected from the device, and the device is turned off. The data from the first row is then written to the second line of the device, and new data is loaded into the first line of the device. The media is again exposed. This is repeated until the entire region of the drum is completely exposed. The device can be repositioned to cover a different region of the drum and the process would be repeated.

20 Claims, 3 Drawing Sheets

6,061,075

NON-SYSTOLIC TIME DELAY AND INTEGRATION PRINTING

This application is a Continuation of application Ser. No. 07/824,660 filed Jan. 23, 1992, which is now abandoned.

BACKGROUND OF THE INVENTION

1. Field of the Invention

This invention relates to methods of printing, more specifically to printing using spatial light modulators.

2. Background of the Invention

The use of spatial light modulators in conjunction with a light source has many advantages over other types of optical printing, such as those employing scanned lasers. The spatial light modulator can use simpler illumination schemes, normally requires less peripheral equipment, and less power. Printing on large-area, low-sensitivity photosensitive materials, however, does bring up new areas of concern.

One of the many areas such photosensitive materials are used is in the patterning of printed circuit boards (PCBs), and printing plates. Normally, a sheet of such material or the negative that will be used to expose such media is wrapped around a drum, and the desired pattern is exposed onto the sheet using lasers while the drum spins, much like a xerographic printer. It would be an advantage to use spatial light modulators for reasons discussed above.

Some problems exist, however, with the use of spatial light modulators (SLMs), such as liquid crystal display cells (LCD), or deformable mirror devices (DMDs). In order for the machine to be cost-effective, it must produce a certain number of completed sheets of material in a given time frame. As it turns out, this requirement is difficult to meet using standard light sources and simple modulators. The light is not bright enough to expose the media within the time limit, as it is a "slow" media, requiring long exposure.

One solution is discussed in U.S. Pat. No. 5,049, 901. This solution uses a 1000 cell X 100 line spatial light modulator array. The data is loaded onto the cells of the array from the top down. After the first line of data is loaded onto the first row of cells, it is exposed onto the drum. Then the first line of data is then shifted down to the second row of cells. The second line of data is loaded onto the first row of cells, and then these two rows are exposed. The data shifting down the array is coordinated with the spinning of the drum, so the same data is exposed onto the same line on the drum for approximately 100 lines.

Typically, the illumination patterns from conventional light sources are brighter in the center than at the edges, and no illumination pattern is completely uniform. This is corrected with the last lines of the array. Depending on the amount of correction necessary, the number of lines is up to the designer. The center cell or cells are turned off after a predetermined number of lines. The cells on either side of the center region are left on for a pre-determined number of lines. The cells further away from the center regions are left on for even more lines. This continues until the last line, in which only the cells at the edges remain on. In this way, the darker areas of the image are exposed for longer durations to equalize exposure time across the image.

This solution involves the use of a modulator array consisting of an array of shift registers rather than conventional x/y addressing. The registers shift the data down the array, as discussed previously. For some applications, or some modulators, shift registers are impractical because of the amount of space they require. In the case of the DMD, the complexity of the shift registers makes it difficult to manufacture the device using the already-established processing techniques.

SUMMARY OF THE INVENTION

The present invention disclosed herein comprises a method of printing or exposing photosensitive media using the cells of a standard spatial light modulator and standard addressing circuitry that allows the use of a less-powerful lamp, and smaller geometries of addressing circuitry. It is an advantage of this invention that it does not require a custom spatial light modulator.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE PREFERRED EMBODIMENTS

Figure 1A:
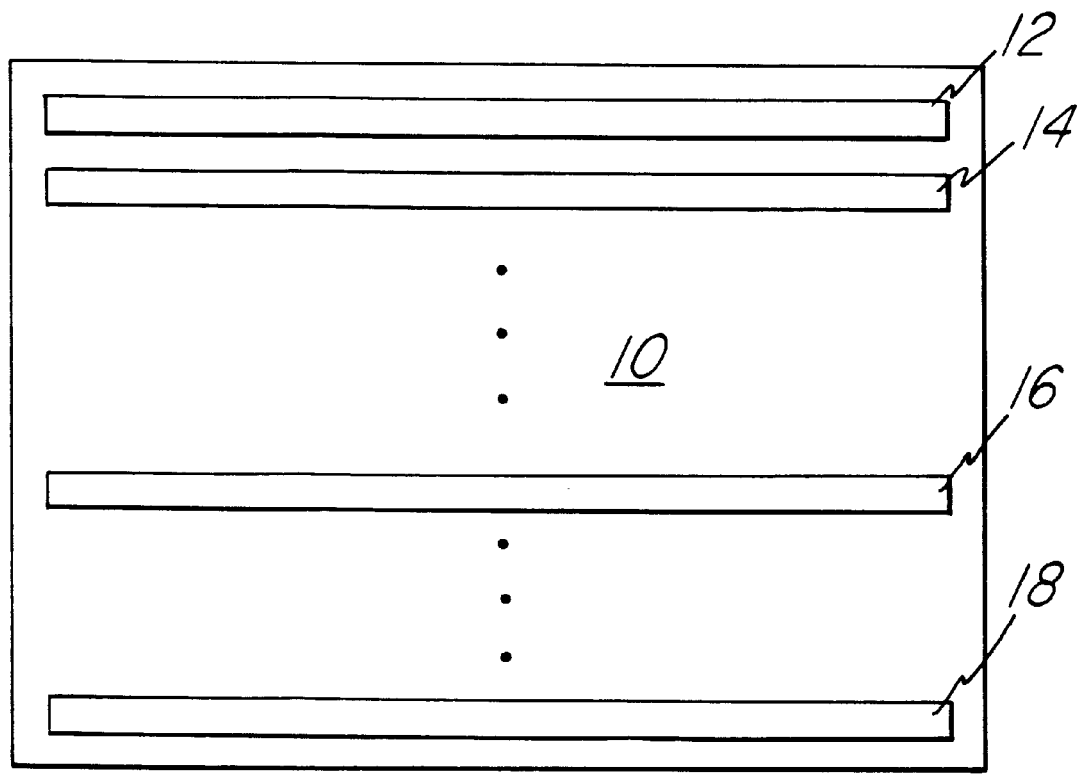
FIG. 1A shows a spatial light modulator.

FIG. 1A shows a typical spatial light modulator array 10. The modulator may consist of individual cells, or cells grouped in regions, such as lines. The modulator shown has lines depicted, but it is understood that these lines could consist of hundreds of cells. Similarly, the modulator could be of any type, but for discussion purposes, the modulator discussed will be of the deformable mirror type. Deformable mirror devices (also know as digital micromirror devices) or DMDs, consist of a multiplicity of tiny mirrors suspended over an air gap. Addressing circuitry is associated with each tiny mirror, which causes the mirror to deflect in one direction or another, depending on the architecture of the DMD, and the data in the addressing circuitry. The addressing circuitry normally consists of one or more transistors and is preferably underneath the air gap on the substrate. When a transistor is turned on, electrostatic forces build in the air gap, causing the mirror to be deflected towards the transistor.

The array shown is assumed to be 768 cells wide, and 576 lines long, a configuration that is currently manufactured by the assignee of the present invention for video applications. Row 1 on the modulator, designated by reference numeral 12, is at the top of the device. It is loaded with data for the first line to be exposed on the photosensitive media. After it is exposed, the illumination must be turned off. Unlike the method previously discussed with respect to U.S. Pat. No. 5,049,901, the data is not shifted down the device. Instead, according to the preferred embodiment, the entire device is rewritten. The first line of data is then written to the addressing circuitry for row 2 on the device, shown with reference numeral 14. The data for data line 2 is written onto the addressing circuitry for row 1 on the device. This is repeated until the entire device minus whatever number of correction lines has been filled with data. When the next line is written to modulator row 1, according to the preferred embodiment, it will be data line 477, rather than line 576 for reasons discussed in detail below. The number of lines of data is determined by the size of the drum. Typically, the designer would coordinate the loading of line 1 of data with some feature on the drum. A possible synchronization point would be the area of the drum's surface that has the fixtures which hold the negative in place. Many thousands of lines of data may be necessary to completely expose the entire circumference of the negative on the drum.

Numeral 16 depicts row 476 of the device. The lines between this row and the bottom row of the device 18, which is the 576th line of the array, is used to equalize the illumination profile as previously discussed, and which will be further discussed at FIG. 2B.

Figure 1B:
FIG. 1B shows a timing diagram for the exposure time of a spatial light modulator.

FIG. 1B shows the timing of the light source for the above scheme. The horizontal axis 20 is the time axis. The vertical axis 22 is the illumination intensity axis. During the time interval between tic marks 24 and 26, the light is on the device. During the interval between tic marks 26 and 28, the illumination is off as the data is written to the device. The entire interval shown by tic marks 24 to 28 on the horizontal axis is the amount of time to expose and then rewrite the device.

Obviously, as can be seen by this diagram, the illumination is only on a fraction of the total interval 28. This low duty cycle may result in a loss of brightness as great as an order of magnitude. However, this loss is not as drastic as it seems, as it can be compensated for in other areas. For example, using multiple devices in tandem requires less repositioning to cover the entire negative, making the overall system using spatial light modulators faster than first considered. As another example, all 576 rows do not have to be used. To write 100 rows as in the method previously discussed in U.S. Pat. No. 5,049,091, it takes a modulator with circuitry such as the DMD 25 $\mu$seconds to complete the operation.

Figure 2A:
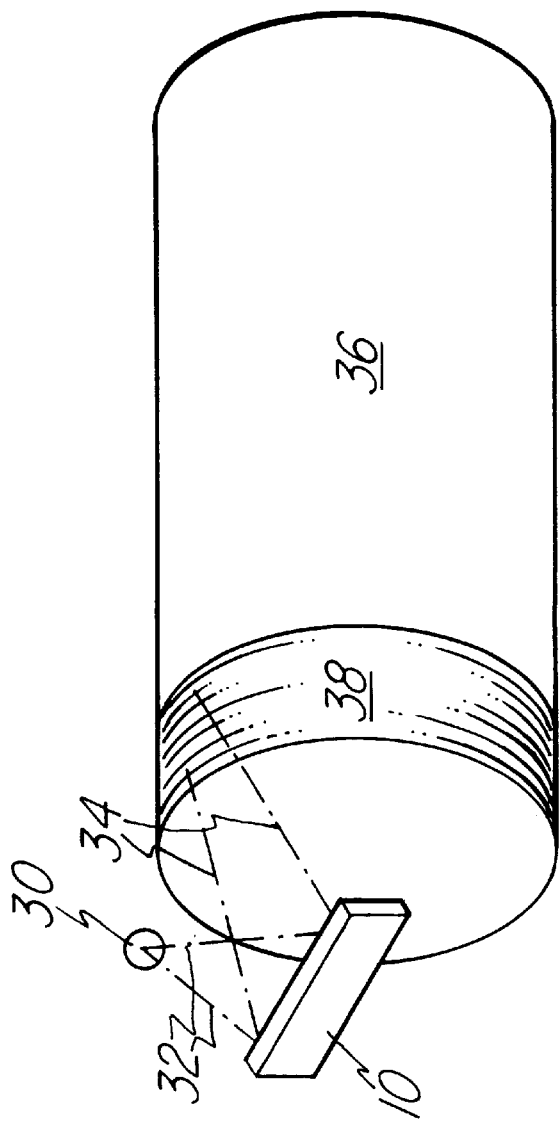
FIG. 2A shows a spatial light modulator and the area it exposes on a photoreceptor drum.

FIG. 2A shows the modulator positioned to write onto or expose the drum. The light could be positioned somewhere around position 30, and the light would travel along path 32 to the modulator array 10. Typically, there are optical elements such as lenses or mirrors in this path. Since the geometry of the path and the combination of the elements have so many possible variations, they are not shown.

As light from path 32 impinges upon the modulator, the selected cells on the modulator direct their respective portions of the beam to the drum 36 along path 34. The cells that are not selected to send light to the drum can be configured to either return light back to the source or to direct it away from the drum in another direction. The selection depends on the confines of the optical system and the capabilities of the spatial light modulator.

Region 38 on drum 36 shows the area being exposed on the photosensitive material on the face of the drum. Photosensitive, in the application, is meant to include any material that develops some kind of differentiation that can be exploited for printing between areas exposed to radiation and areas not exposed to the radiation. The radiation is typically in the infrared to ultraviolet range, due to the availability of sources and optics, but is not assumed to be limited to that range. The photosensitive media could be intended for use as a negative for a printing process, such as in printing negatives for printed circuit boards, (PCBs), an offset printing plate, a film or paper positive (a negative that has been color or contrast reversed), or other such items. Additionally, this media could be the finished photographic product. For example, instead of making a negative to pattern the PCB, the board itself could be patterned directly. Additionally, other items could be printed or exposed directly, such as film or paper positives.

Figure 2B:
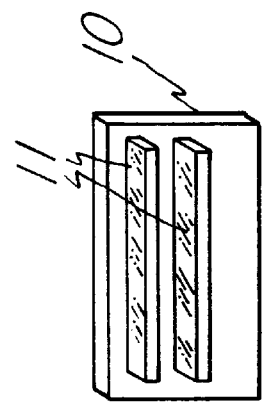
FIG. 2B shows a portion of the face of a modulator which would be active when it has been fully loaded with a data pattern that might be used.

FIG. 2B shows what the data would possibly look like on the face of the modulator 10 as if seen from the drum. The region 11, that is not hatched is the area being used to balance out the illumination profile.

Figure 3:
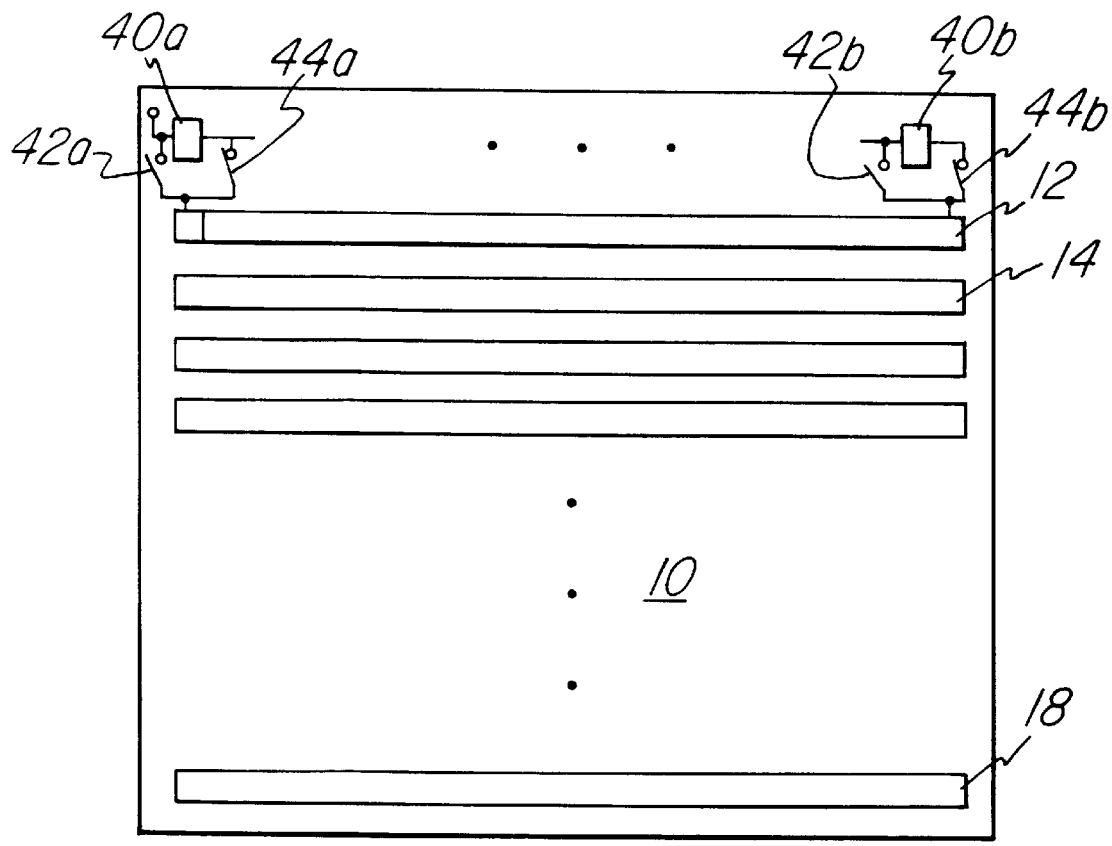
FIG. 3 shows an adapted spatial light modulator.

In order to further overcome the limitation of rewriting the device every cycle, an adaptation of the video chip is shown in FIG. 3. A bank of shift registers 40A–40B are now at the top of the modulator 10. This is used to load the data into the columns of addressing circuitry. This can be used to speed up the write time of the device during the OFF part of the cycle. Instead of resetting the device and then loading all of the data lines into the device from off-chip, switches 42A–42B are activated and the data currently in row 12 can be written up into shift register 40, the switches 42A–42B are then returned to the position shown and the data written down into row 14. Switches 44A–44B are closed as shown in this figure for writing. Each set of switches, such as 42A and 44B, are tied together such that when 42A is open 44B is closed and when 42A is closed 44B is open. This configuration of the device eliminates a vast amount of off-chip processing, and limits the off-chip accesses to one row of data per line time. This speed-up will decrease the OFF interval in the timing diagram of FIG. 1B and also decrease the brightness loss discussed previously.

The final problem addressed by this invention is that of bandwidth. In the method discussed in U.S. Pat. No. 5,049,091, the output of the processor driving the device would typically be 50 Mhz or $500 \times 10^5$. In order to write 1000 columns, the entire device, at that data rate, the load time must be $1000/50 \times 10^6$, which equals $20 \times 10^{-6}$, (20 $\mu$seconds). Most binary (ON/OFF) spatial light modulators cannot be fully refreshed in 20 $\mu$seconds.

However, if the number of pixels to be written increased, by lining chips up together, (if the chip size was fixed), this could be reduced. Two 768×576 pixel chips together would mean that the processor would write 1536 columns per line so the line time would be $1536/50 \times 10^6$, or 30 $\mu$seconds, which is more reasonable, as the device refresh rate for modulators such as the DMD is approximately 25 $\mu$seconds (0.5 $\mu$seconds per line, loading 50 lines from the top, and 50 lines from the bottom, simultaneously, equals 25 $\mu$seconds). Three chips used in tandem would give even more flexibility within a given time frame. Three chips of 768 pixels wide have a time of $2304/50 \times 10^6$, or 46 $\mu$seconds. At this point the present embodiment of the invention is limited in speed not by the modulator, but by the output of the data, at 50 MHz. Additionally, if the array size is not fixed, and one could use a chip that was larger, such as 1920×1080 pixels, the writing time would obviously be lengthened even more.

In short, a standard modulator with standard addressing can emulate or surpass the performance of a system using a customized device, using 100 of its 576 available rows. The standard modulator also give two further advantages. The first is system flexibility. With an array such as 768×576, instead of 1000×100, there are more rows to be used. The use of multiple devices allows the designers to consider a trade off not previously available. For example, using the 46 $\mu$second margin discussed above, another 25 lines on top and bottom could be loaded. This would take 37.5 $\mu$seconds, and add a total of 50 lines of data. They can use a lamp that does not have to be as bright as the current source, making it cheaper. The trade off is that the third device may cost more.

Another consideration not previously available is resolution control. The extra rows on the modulator can be used to increase the resolution, allowing the equalization of the illumination profile to be more exact.

The second advantage not available in the customized-device system, is the use of already-established addressing schemes. An example of some of these schemes can be found in U.S. Pat. Ser. No. 678,761. Further, using the standardized modulator, which has data inputs on both the top and bottom, an addressing scheme could be used that accesses both the top and bottom of the modulator, as previously mentioned.

Figure 4:
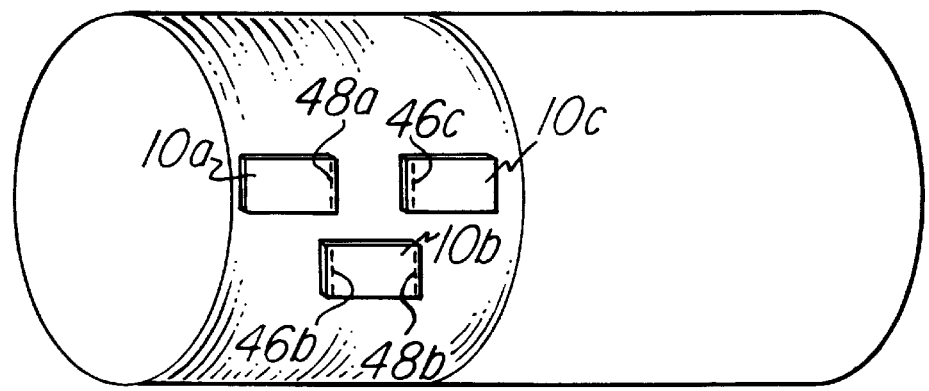
FIG. 4 shows three spatial light modulators and the area they expose on a photoreceptor drum.

An example of chips used in concert is shown in FIG. 4. The light impinges upon the modulators 10A, 10B, 10C, simultaneously. The light from the selected cells of the devices will impinge upon the drum the drum 36 in region 38. The devices would most likely have to be aligned to eliminate the gaps between the right-most column of cells 48A, on device 10A, and the left-most column 46B, of device 10B, and between 48B and 46C. One of the many advantages of this is that the arm holding the devices (not shown) would only have to be repositioned one third as many times as previously required. This again lowers the amount of time used overall. This could also be repeated for as many devices from which the optics can effectively receive light. It is possible that an entire line of devices could be set together so that the entire drum is exposed in one positioning of the arm, eliminating any possible errors from incorrect positioning during the steps across the drum.

Thus, although there has been described to this point particular embodiments of a method of printing using spatial light modulators with standard addressing circuitry, it is not intended that such specific references be considered as limitations upon the scope of this invention except in-so-far as set forth in the following claims.

What is claimed is:

1. A method of printing using at least one spatial light modulator, each said modulator comprised of an array of individually addressable cells and corresponding addressing circuitry, said method comprising the steps of:
    a. printing lines of data, said printing step comprising the steps of:
        i. writing image data to said addressing circuitry of said modulator;
        ii. illuminating said modulator with light from a light source;
        iii. reflecting said light to a photosensitive media with said modulator such that said reflected light forms an image on said photosensitive media;
        iv. writing new data to the addressing circuitry of the entire modulator such that each line of data previously written to said addressing circuitry is written to a row of said addressing circuitry adjacent said line's previous position;
    b. repeating steps i. through iv. of said printing step until a predetermined region on said photosensitive media has been completely exposed; and
    c. repositioning said at least one modulator to expose a different region on said photosensitive media.

2. The method of claim 1 wherein said spatial light modulator is a digital micromirror device.
3. The method of claim 1 wherein said photosensitive media is a negative.
4. The method of claim 3 wherein said negative is for a printed circuit board.
5. The method of claim 3 wherein said negative is for an offset printing plate.
6. The method of claim 1 wherein said photosensitive media is a finished photographic product.
7. The method of claim 6 wherein said photographic product is a printed circuit board.
8. The method of claim 6 wherein said photographic product is an offset printing plate.
9. The method of claim 6 wherein said photographic product is a film positive.
10. The method of claim 6 wherein said photographic product is a paper positive.
11. A method of printing using at least one spatial light modulator, each said modulator comprised of an array of individually adressable cells and corresponding addressing circuitry, said method comprising the steps of:
    a. printing lines of data, said printing step comprising the steps of:
        i. writing image data to said addressing circuitry of said modulator;
        ii. illuminating said modulator with light from a light source;
        iii. reflecting said light to a photosensitive media with said modulator such that said reflected light forms an image on said photosensitive media;
        iv. writing new data to the addressing circuitry such that each line of data previously written to said addressing circuitry is written to a row of said addressing circuitry adjacent the previous position of said line; and
    b. repeating said printing step until a predetermined region on said photosensitive media has been completely exposed.
12. The method of claim 11 wherein said spatial light modulator is a digital micromirror device.
13. The method of claim 11 wherein said photosensitive media is a negative.
14. The method of claim 13 wherein said negative is for a printed circuit board.
15. The method of claim 13 wherein said negative is for an offset printing plate.
16. The method of claim 11 wherein said photosensitive media is a finished photographic product.
17. The method of claim 16 wherein said photographic product is a printed circuit board.
18. The method of claim 16 wherein said photographic product is an offset printing plate.
19. The method of claim 16 wherein said photographic product is a film positive.
20. The method of claim 16 wherein said photographic product is a paper positive.

* * * * *